(12) United States Patent
Cai

(10) Patent No.: US 7,750,401 B2
(45) Date of Patent: Jul. 6, 2010

(54) SELF-ALIGNED COMPLEMENTARY LDMOS

(75) Inventor: Jun Cai, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/481,108

(22) Filed: Jun. 9, 2009

(65) Prior Publication Data

US 2009/0242982 A1   Oct. 1, 2009

Related U.S. Application Data

(63) Continuation of application No. 11/695,199, filed on Apr. 2, 2007, now abandoned.

(60) Provisional application No. 60/788,874, filed on Apr. 3, 2006.

(51) Int. Cl.
    *H01L 29/76*     (2006.01)
    *H01L 29/94*     (2006.01)
    *H01L 31/062*     (2006.01)
    *H01L 31/113*     (2006.01)
    *H01L 31/119*     (2006.01)

(52) U.S. Cl. ................ 257/335; 257/336; 257/E29.256

(58) Field of Classification Search ................ 257/335, 257/336, 339, 344, 389, 408, E29.027, E29.066, 257/E29.256

See application file for complete search history.

(56) References Cited

U.S. PATENT DOCUMENTS 7,569,884 B2 *  8/2009  Lee ............................ 257/343

* cited by examiner

*Primary Examiner*—Hoai v Pham
(74) *Attorney, Agent, or Firm*—Thomas R. FitzGerald, Esq.; Hiscock & Barclay, LLP

(57) ABSTRACT

The invention includes a laterally double-diffused metal-oxide semiconductor (LDMOS) having a reduced size, a high breakdown voltage, and a low on-state resistance. This is achieved by providing a thick gate oxide on the drain side of the device, which reduces electric field crowding in the off-state to reduce the breakdown voltage and forms an accumulation layer in the drift region to reduce the device resistance in the on-state. A version of the device includes a low voltage version with a thin gate oxide on the source side of the device and a high voltage version of the device includes a thick gate oxide on the source side. The LDMOS may be configured in an LNDMOS having an N type source or an LPDMOS having a P type source. The source of the device is fully aligned under the oxide spacer adjacent the gate to provide a large SOA and to reduce the device leakage.

29 Claims, 16 Drawing Sheets

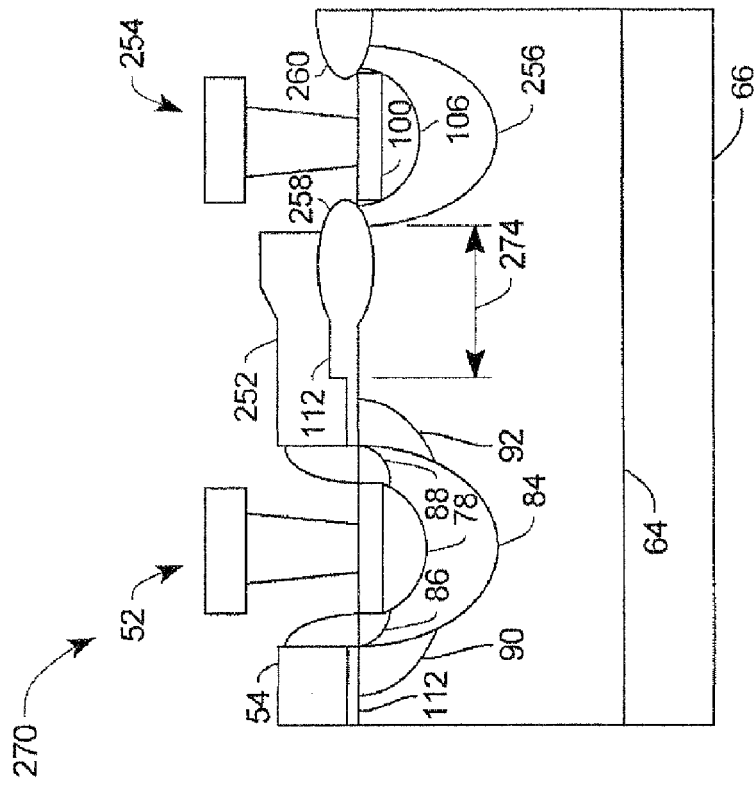
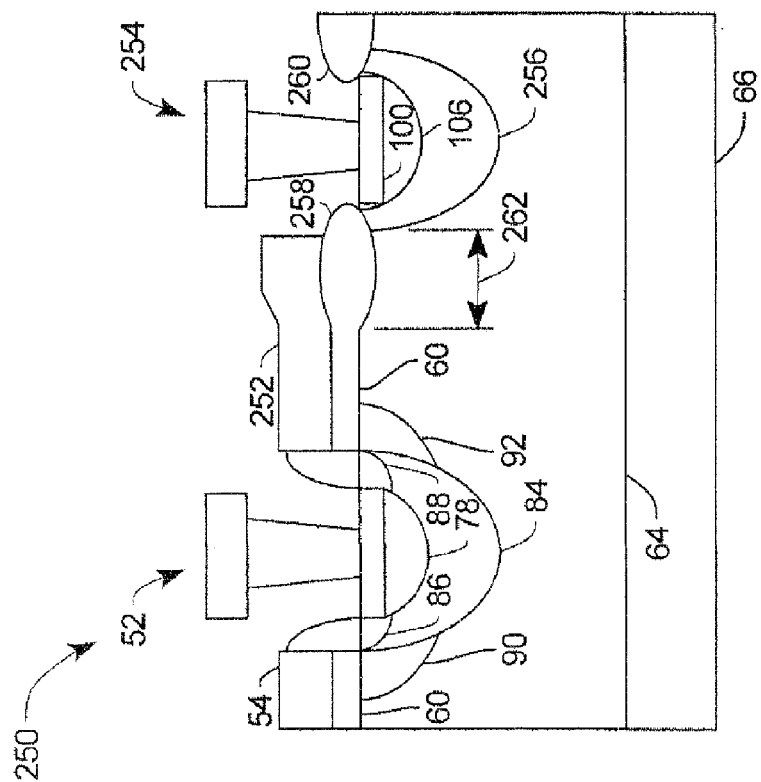

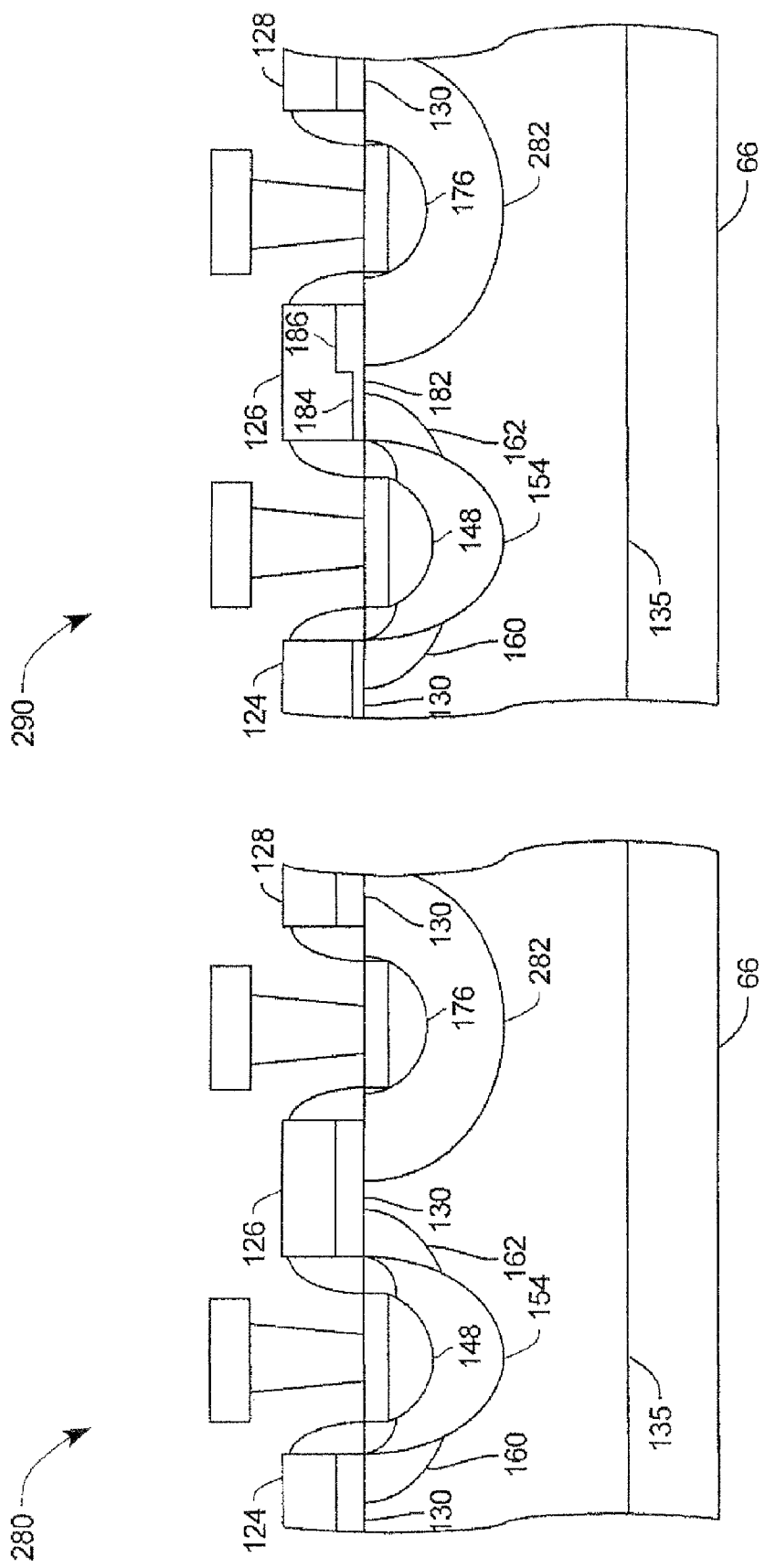

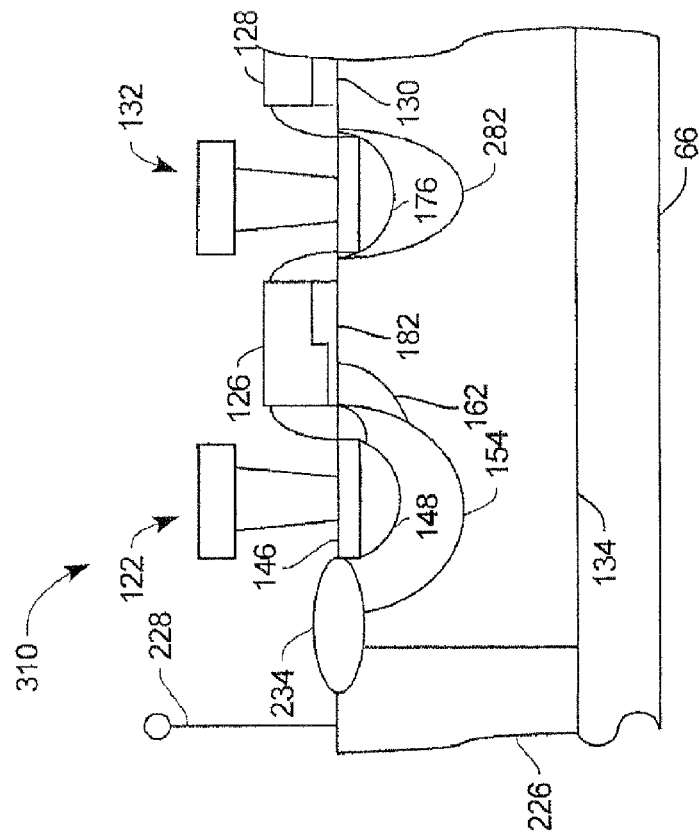
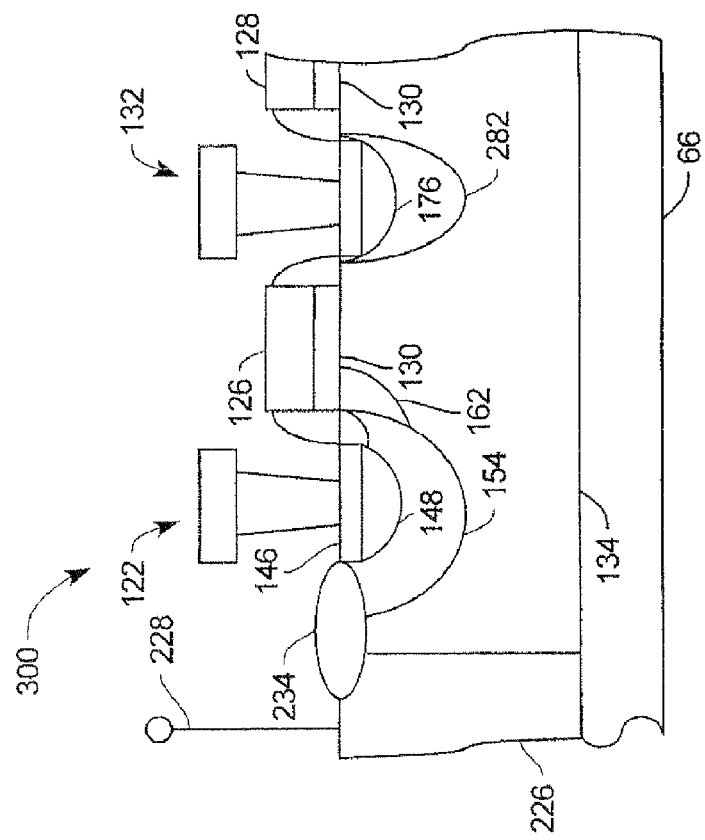

SELF-ALIGNED COMPLEMENTARY LDMOS

CROSS REFERENCE TO RELATED APPLICATIONS

This application is a continuation of U.S. patent application Ser. No. 11/695,199 filed Apr. 2, 2007, which claims the benefit of U.S. Provisional Application No. 60/788,874 filed on Apr. 3, 2006. Both applications are incorporated herein by reference.

FIELD OF THE INVENTION

This invention relates to semiconductor devices, and more specifically to LDMOS devices.

BACKGROUND OF THE INVENTION

In MOS power devices, such as a lateral double-diffusion metal-oxide semiconductor (LDMOS) device, there is generally a tradeoff between three factors: breakdown voltage (BVdss), on-state resistance (Rdson), and safe operating area (SOA), wherein BVdss and Rdson have a conflicting relationship (e.g., an increase in BVdss results in a higher Rdson), BVdss and SOA aid each other (e.g., an increase in BVdss results in a larger SOA), and Rdson and SOA may have a conflicting or aiding relationship. The BVdss may be increased by spacing the drain region from the gate, thus forming a drift region. Such a drift region, however, increases the Rdson, which in conventional devices is proportional to the pitch between the drain and the source. Therefore, in conventional devices raising the BVdss in a device design will increase the Rdson.

Therefore what is needed is a LDMOS device that has a combination of a higher BVdss, lower Rdson, and higher SOA then conventional devices.

SUMMARY OF THE INVENTION

An embodiment of the present invention provides a self-aligned LDMOS device having a gate with a gate oxide, and an oxide spacer on a source side of said gate, a source region having a tap and a source spacer embedded in a source well, the tap being aligned with an edge of the oxide spacer and the source spacer being aligned with the edge of the oxide spacer and the gate polysilicon such that the source spacer is fully under the oxide spacer, and a drain region situated opposite to the source side of said gate, the drain region having a drain embedded in a drain well.

In one form, the invention comprises a self-aligned LDMOS device having a gate situated on a high voltage well, the gate having a gate oxide on the high voltage well and a polysilicon layer on the gate oxide, a source region in the high voltage well on a source side of said gate, a drain region in the high voltage well on a drain side of said gate, and wherein the gate oxide is thick on the drain side of said gate.

An embodiment of the invention is a method of forming a self-aligned LDMOS device by providing a high voltage well with an oxide layer and a polysilicon layer, etching the oxide layer and the polysilicon layer to form a source region and a gate region with a gate therebetween, forming a source well in the source region of the high voltage well and a drain well in the drain region of the high voltage well, implanting a source body in the source region extending from the source well under the gate, implanting a source in the source well, and forming an oxide spacer over the source an adjacent the gate such that the oxide spacer fully covers the source.

BRIEF DESCRIPTION OF THE DRAWINGS

The features and advantages of this invention, and the manner of attaining them, will become apparent and be better understood by reference to the following description of the various embodiments of the invention in conjunction with the accompanying drawings, wherein:

FIG. 7 is a diagrammatical view of a multi-gated self-aligned N channel LDMOS device according to still another embodiment of the present invention;

FIG. 8 is the N channel LDMOS device of FIG. 5 with a split gate oxide;

FIG. 9 is a diagrammatical view of a multi-gated self-aligned P channel LDMOS device according to another embodiment of the present invention;

FIG. 10 is the P channel LDMOS device of FIG. 9 with a split gate oxide;

FIG. 11 is a diagrammatical view of a multi-gated self-aligned P channel LDMOS device according to still another embodiment of the present invention;

FIG. 12 is the P channel LDMOS device of FIG. 11 with a split gate oxide;

Figure 1:
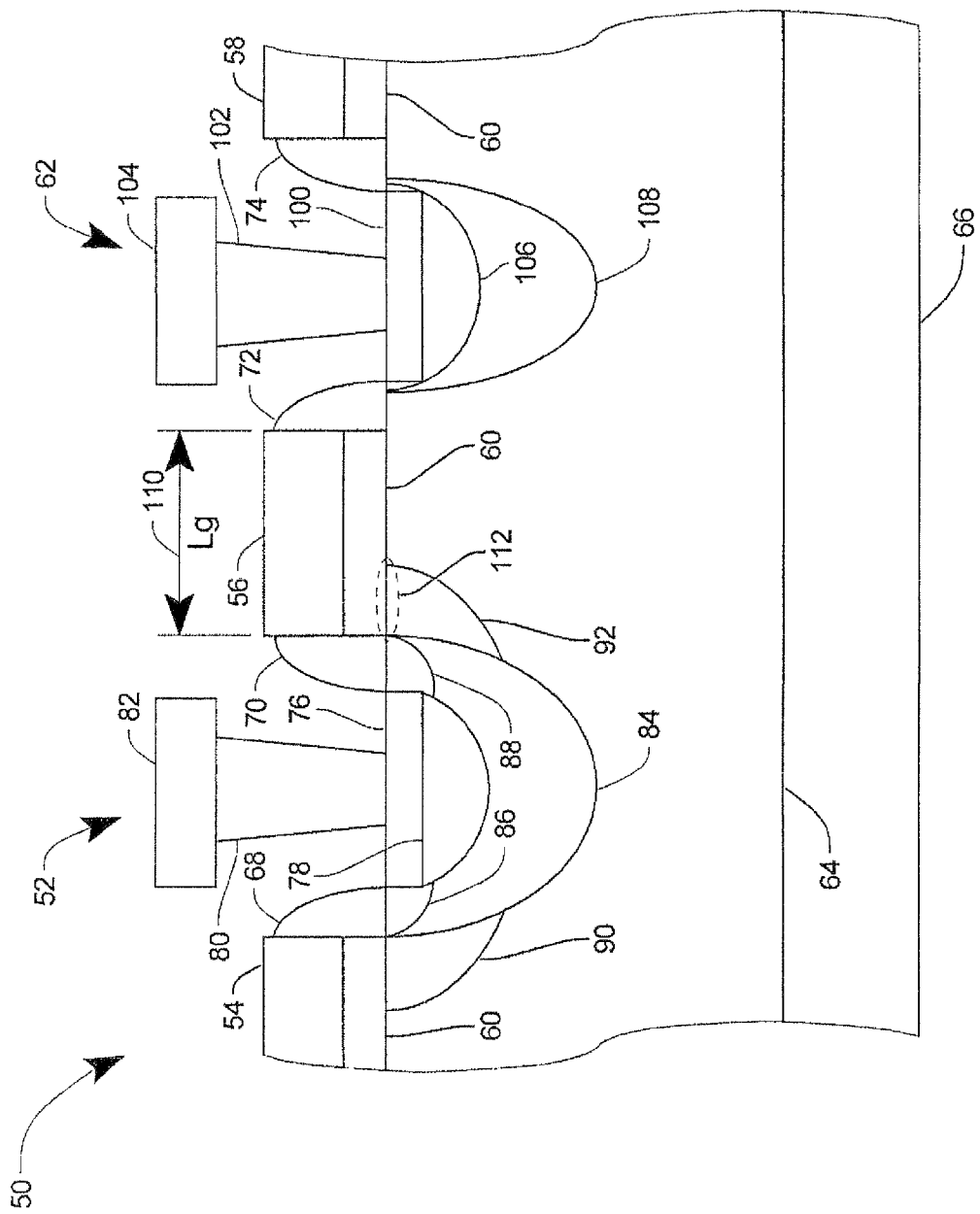
FIG. 1 is a diagrammatical view of a multi-gated self-aligned N channel LDMOS device according to an embodiment of the present invention.

It will be appreciated that for purposes of clarity, and where deemed appropriate, reference numerals have been repeated in the figures to indicate corresponding features. Also, the relative size of various objects in the drawings has in some cases been distorted to more clearly show the invention. The examples set out herein illustrate several embodiments of the invention but should not be construed as limiting the scope of the invention in any manner.

DETAILED DESCRIPTION

Referring to FIG. 1, there is shown an n-type embodiment 50 of a fully self-aligned complementary LDMOS device according to one embodiment of the present invention. As shown in FIG. 1 the LDMOS device 50 is a multiple gate device. The LNDMOS 50 includes a source 52, three gates 54, 56, and 58 each having a thick gate oxide 60, and a drain 62. The gate 56 is between the source 52 and the drain 62, while the gate 54 is on the opposite side of the source 52, and the gate 58 is on the opposite side of the drain 62. The source 52 and drain 62 are formed in a high voltage HV NWELL 64. Under the HV NWELL 64 may be another layer 66 which may be an N buried layer or an N isolation layer depending on the use of the LDMOS 50, such as whether the LDMOS 50 is used in a CMOS device or if the LDMOS 50 is subjected to relatively high voltages compared to lower voltage devices in an integrated circuit.

As shown in FIG. 1 the gate 54 has a right sidewall oxide 68, the gate 56 has a left (on its source side) sidewall oxide 70, and a right (on its drain side) sidewall oxide 72, and the gate 58 has a left sidewall oxide 74. The source 52 has a silicide layer 76 with a contact 80 to a metal layer 82 on top of a P+ tap 78. The P+ tap 78 forms a source region enclosed below and on most of its sides by a P well 84 which extends downward into the HV NWELL 64. The portion of the sides of the P+ tap 78 not enclosed by the P well 84 makes contact with two N+ source spacers 86 and 88, the N+ source spacer 86 filling the gap between the top of the HV NWELL 64 and the vertical projection of the right side of the gate 54, and the N+ source spacer 88 filling the gap between the top of the HV NWELL 64 and the vertical projection of the left side of the gate 56. The N+ source spacers 86 and 88 extend from the top surface of the HV NWELL 64 downward to just below the top edge of the P+ tap 78. Extending vertically from the upper sides of the HV NWELL 64 to the top surface of the HV NWELL 64 and laterally to under the gate oxides 60 of the gates 54 and 56 are two P bodies 90 and 92, respectively.

The relatively small and shallow N+ source spacers 86, 88 are self aligned to the gate poly and are only under the sidewall oxide spacers 68, 70. The P+ tap 78 is a very large percentage of the source area and is self aligned to the sidewall oxide spacers 68, 70, and together with the N+ source spacers 86, 88 lie inside the P well 84 provide a large SOA, low leakage, and small device size. Moreover, The effective channel length 112 is controlled by the angle implant and lateral diffusion of the P bodies 90, 92 during the gate seal oxidation. The threshold voltage (Vt) is controlled by the effective channel region 112 and the P body 90,92. The short effective channel length 112 provides for low channel resistance. As a result the gate poly length 110 can be the minimum design feature dimension.

The drain 62 has a silicide layer 100 with a contact 102 to a metal layer 104 on top of an N+ drain region 106. Below and on the sides of the N+ drain region 106 is an N well 108 which has a higher dopant concentration than the HV NWELL 64. The N well 108 extends laterally to under the sidewall oxides 72 and 74. The deep N well 108 in the drain 62 causes current flow deep in the HV NWELL 64 to reduce the drain region electric field.

The gate length (Lg) is indicated by reference number 110, and the effective channel region is the region 112.

The BVdss of the device 50 is less than the gate oxide breakdown voltage, and therefore restricts the lower limit of the thick gate oxide. For example, in one embodiment of the present invention a gate oxide thickness of 400 Å restricts the BVdss to about 45 volts.

Figure 2:
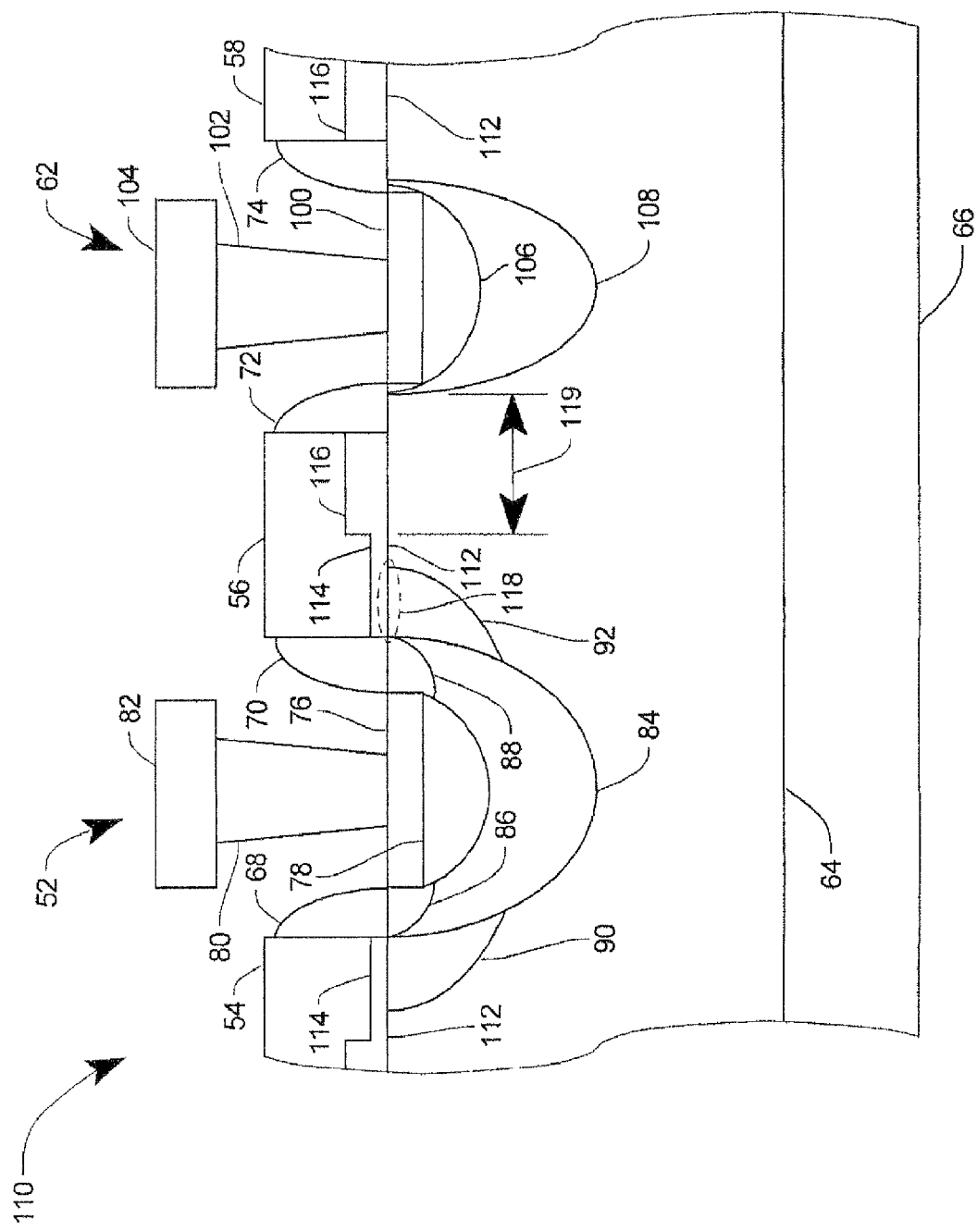
FIG. 2 is the N channel LDMOS device of FIG. 1 with a split gate oxide.

FIG. 2 a split gate oxide N channel LDMOS device 110 which is the N channel LDMOS device 50 of FIG. 1 with the split gate oxides 112 having a thinner portion 114 on the source side of the gates 54, 56, and a thicker portion 116 on the drain side of the gates 56, 58. Region 118 is the effective channel of the split gate oxide 112, and reference number 119 indicates the length of the drift region of the LDMOS device 110.

In general the thick gate oxide device of FIG. 1 is used for high voltage devices, while the split gate oxide device of FIG. 2 is used for low voltage devices. The BVdss is related to the drift region 119 and the thick portion 116 of the split gate oxide 112. Moreover, the thick portion 116 reduces the electric field crowding of the drain side of the gate 56 which reduces the drain depletion region and reduces the punch-through voltage.

If the threshold voltage of the thick portion 226 of the split gate oxide 112 (Vta) is related to the surface accumulation layer of the drift region 119, and if the gate to source voltage (Vgs) can be controlled to be equal or greater than Vta, then the resistance of the drift region 119 can be significantly reduced due to the surface accumulation layer on the top of the drift region 119. Thus, under these conditions the upper limit of the thickness of the thick portion 116 of the split gate oxide 112. For example with a thick gate oxide thickness of 400 Å the Vta is about 2 volts while the Vt of a 115 Å thin portion 114 of the gate oxide 112 is about 5 volts.

Figure 3:
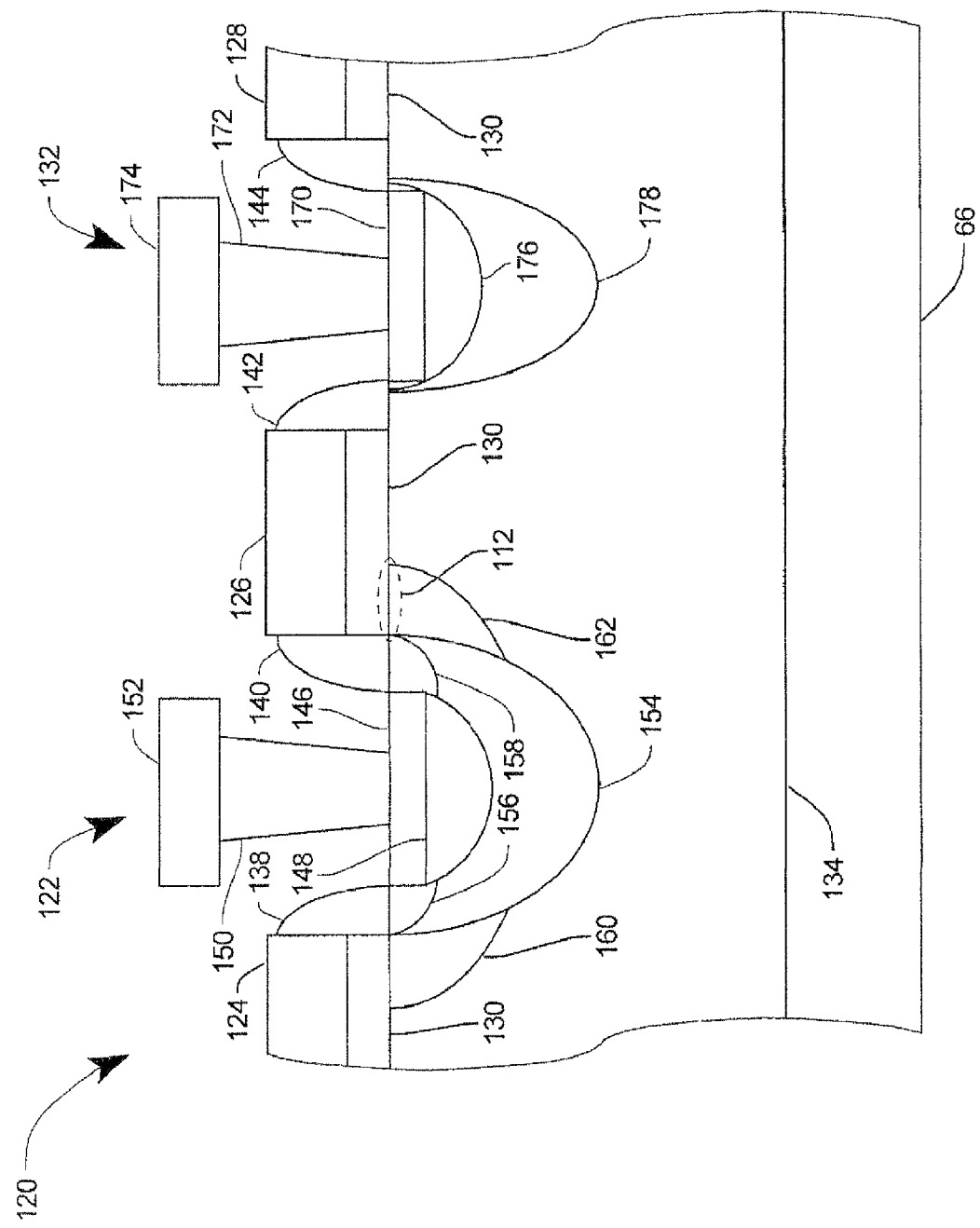
FIG. 3 is a diagrammatical view of a multi-gated self-aligned P channel LDMOS device according to an embodiment of the present invention which is complementary to the N channel LDMOS device shown in FIG. 1.

FIG. 3 is a diagrammatical view of a multi-gated self-aligned P channel LDMOS device 120 according to an embodiment of the present invention which is complementary to the N channel LDMOS device shown in FIG. 1. The P channel LDMOS device 120 includes a source 122, three gates 124, 126, and 128 each having a gate oxide 130, and a drain 132. The gate 126 is between the source 122 and the drain 132, while the gate 124 is on the opposite side of the source 122, and the gate 128 is on the opposite side of the drain 132. The source 122 and drain 132 are formed in a high voltage HV PWELL 134. Under the HV PWELL 134 may be another layer 66 which may be an N buried layer or an N isolation layer depending on the use of the LDMOS 120, such as whether the LDMOS 120 is used in a CMOS device or if the LDMOS 120 is subjected to relatively high voltages compared to lower voltage devices in an integrated circuit.

As shown in FIG. 3 the gate 124 has a right sidewall oxide 138, the gate 126 has a left (on its source side) sidewall oxide 140, and a right (on its drain side) sidewall oxide 142, and the gate 138 has a left sidewall oxide 144. The source 122 has a silicide layer 146 with a contact 150 to a metal layer 152 on top of an N+ tap 148. The N+ tap 148 forms a source region enclosed below and on most of its sides by an N well 154 which extends downward into the HV PWELL 134. The portion of the sides of the N+ tap 148 not enclosed by the N well 154 makes contact with two P+ source spacers 156 and 158, the P+ source spacer 156 filling the gap between the top of the HV PWELL 134 and the vertical projection of the right side of the gate 124, and the P+ source spacer 158 filling the gap between the top of the HV PWELL 134 and the vertical projection of the left side of the gate 126. The P+ source spacers 156 and 158 extend from the top surface of the HV PWELL 134 downward to just below the top edge of the N+ tap 148. Extending vertically from the upper sides of the N+ tap 148 to the top surface of the HV PWELL 134 and laterally to under the split gate oxides 130 of the gates 124 and 126 are two N bodies 160 and 162, respectively.

The drain 132 has a silicide layer 170 with a contact 172 to a metal layer 174 on top of a P+ drain region 176. Below and on the sides of the P+ drain region 176 is a P well 178 which has a higher dopant concentration than the HV PWELL 134. The P well 178 extends laterally to under the sidewall oxides 142 and 144.

Figure 4:
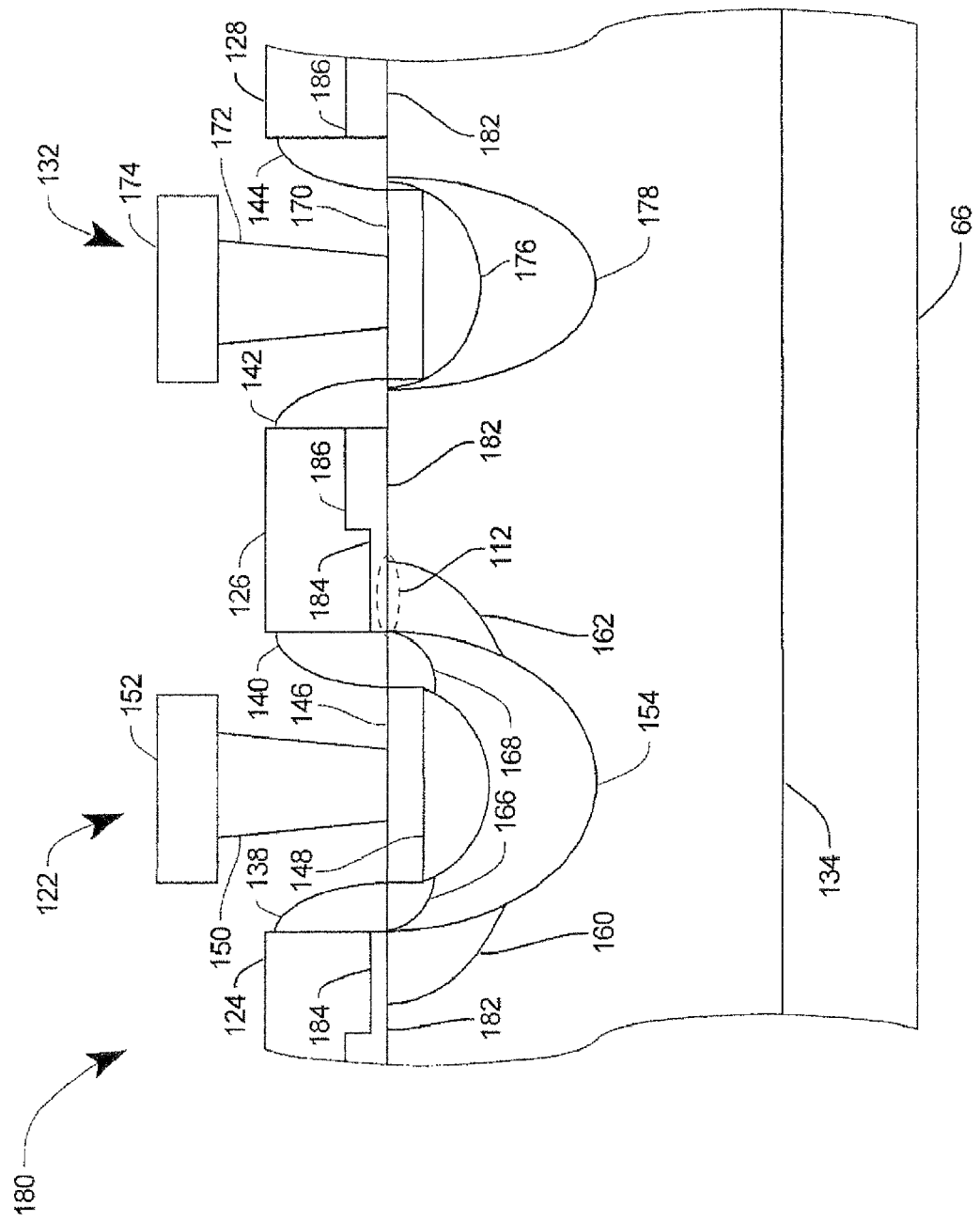
FIG. 4 is the P channel LDMOS device of FIG. 3 with a split gate oxide.

FIG. 4 is a split gate oxide P channel LDMOS device 180 which is the P channel LDMOS device 120 of FIG. 3 with a split gate oxides 182 having a thinner portion 184 on the source side of the gates 124, 126, and a thicker portion 186 on the drain side of the gates 126, 128.

Figure 5:
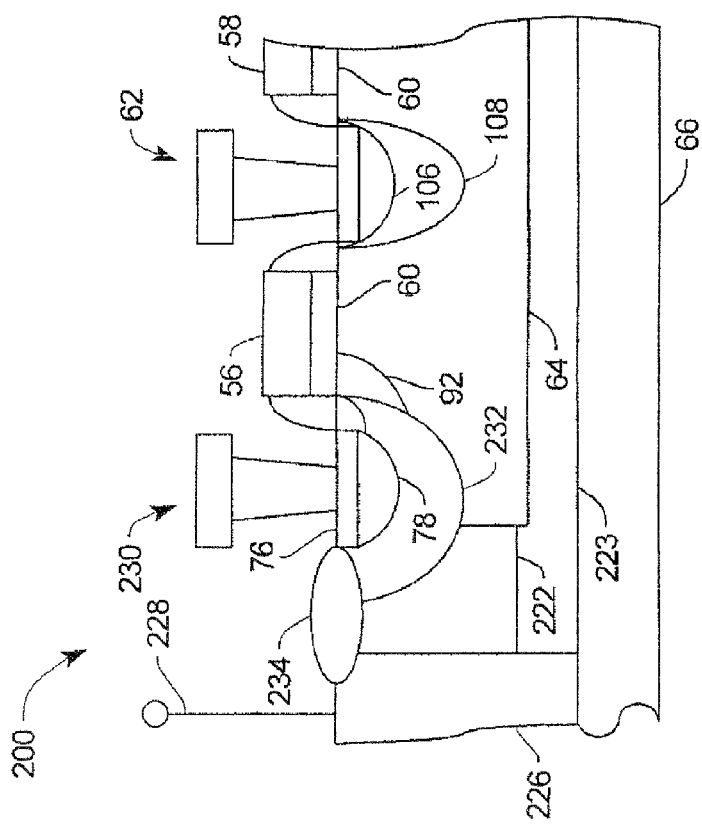
FIG. 5 is a diagrammatical view of a multi-gated self-aligned N channel LDMOS device according to another embodiment of the present invention.

FIG. 5 is a diagrammatical view of a multi-gated self-aligned N channel LDMOS device 200 according to another embodiment of the present invention for isolating the LDMOS device when the device is a high voltage device in an integrated circuit. In FIG. 5 the HV NWELL 64 is surrounded on its bottom and sides by a high voltage P well (HV PWELL) 222. The HV PWELL 222 is surrounded by an oxide ring 224 which, in turn, is surrounded by a HV NWELL 226, which could also be a HV N sink. The HV NWELL ring 226 is connected by terminal 228 to a local high voltage to enhance the isolation of the N channel LDMOS device. The source 52 of FIG. 1 has been modified to form a source 230 in which the P body 90 is not present, and the P well 84 of FIG. 1 has been replaced by a P well 232 which extends laterally further on its left half which is covered by a field oxide 234 at the top surface of the HV NWELL 64. The field oxide 234 extends laterally between the source silicide 76 and inside edge of the HV NWELL ring 226. The fabrication of the high voltage LDMOS device in an integrated circuit with lower voltage devices can be accomplished without any extra thermal diffusions which are usually required for convention power component integration.

Figure 6:
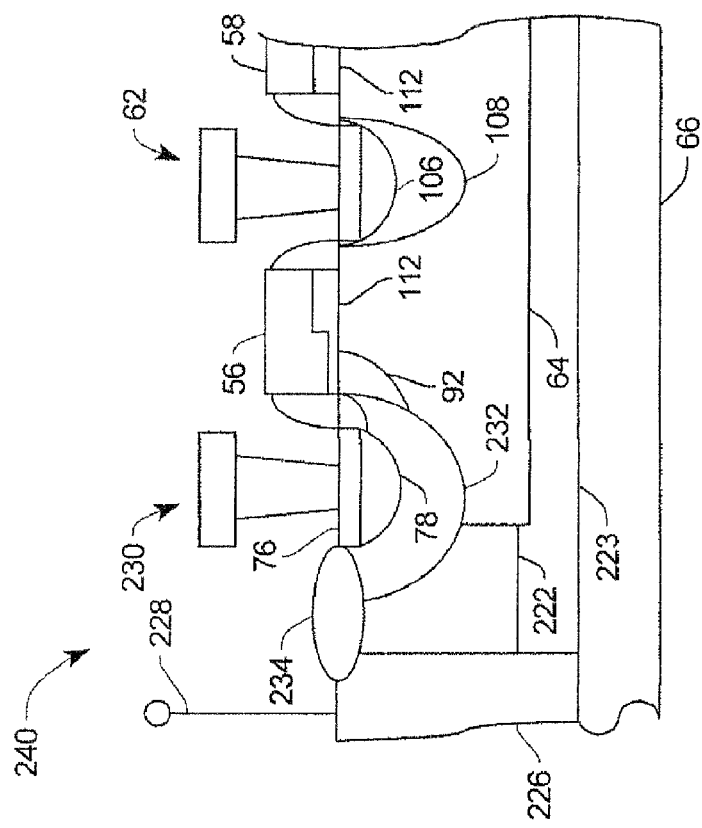
FIG. 6 is the N channel LDMOS device of FIG. 5 with a split gate oxide.

FIG. 6 is a split gate oxide N channel LDMOS device 240 which is the N channel LDMOS device 200 of FIG. 5 with the split gate oxide 112.

FIG. 7 is a diagrammatical view of a multi-gated self-aligned N channel LDMOS device 250 according to still another embodiment of the present invention. In FIG. 7 the drain 62 of FIG. 1 is spaced apart from the gate 252 and modified to form the drain 254 in which an N well 256 is the N well 108 in FIG. 1 which is expanded latterly at the top of the HV NWELL 64 and which lies below two field oxide regions 258 and 260. The field oxide regions 258 and 260 extend from the gate oxides 60 to the edge of the drain silicide 100 closest to the gate 252. The polysilicon layer of the gate 252 extends above the field oxide 258 to a position short of the N well 256 thereby forming a field gap drift region 262.

FIG. 8 is a split gate oxide N channel LDMOS device 270 which is the N channel LDMOS device 200 of FIG. 7 with the split gate oxide 112. Because of the split gate oxide 272 the field gap drift region 274 is longer than the field gap drift region 262 shown in FIG. 7 although the distance between the sources 52 and the drains 254 is the same for both devices.

FIG. 9 is a diagrammatical view of a multi-gated self-aligned P channel LDMOS device 280 according to another embodiment of the present invention. In FIG. 9 a P well 282 replaces the P well 168 in FIG. 3, the P well 282 extending further laterally to approximately center of the gate oxides 126 and 128 thus substantially shortening the channel length.

FIG. 10 is a split gate oxide P channel LDMOS device 290 which is the P channel LDMOS device 280 of FIG. 9 with a split gate oxide 182. In this embodiment the P well 282 extends to approximately the transition of the split field oxide 182 from the thin portion 184 to the thick portion 186.

FIGS. 11 and 12 are diagrammatical views of multi-gated self-aligned P channel LDMOS device 300 and 310, respectively, according to still another embodiments of the present invention. FIGS. 11 and 12 are the P channel equivalents of the N channel LDMOS devices 200 and 240 of FIGS. 5 and 6, respectively. In FIGS. 11 and 12, the HV PWELLs 134 eliminate the need for the HV PWELLS 222 of FIGS. 5 and 6.

Figure 13:
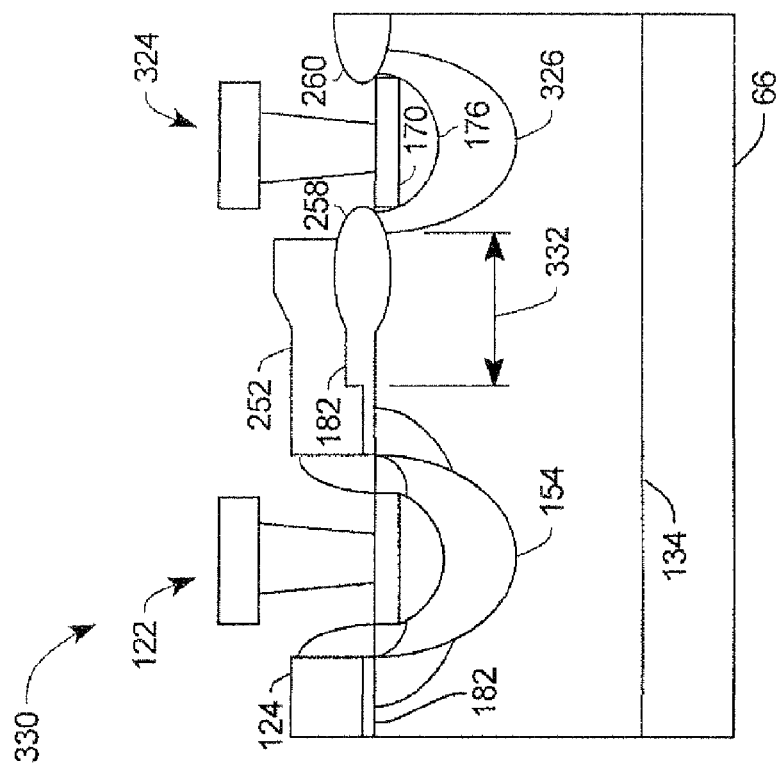
FIG. 13 is a diagrammatical view of a multi-gated self-aligned P channel LDMOS device according to yet another embodiment of the present invention.

FIG. 13 is a diagrammatical view of a multi-gated self-aligned P channel LDMOS device 320 according to yet another embodiment of the present invention. In FIG. 13 the drain 132 of FIG. 3 is spaced apart from the gate 322 and modified to form the drain 324 in which a P well 326 is the P well 178 in FIG. 3 expanded latterly at the top of the HV PWELL 134 and lies below two field oxide regions 258 and 260. The field oxide regions 258 and 260 extend from the gate oxides 130 to the edge of the drain silicide 170 closest to the gate 322. The polysilicon layer of the gate 322 extends above the field oxide 258 to a position short of the P well 326 thereby forming a field gap drift region 328.

Figure 14:
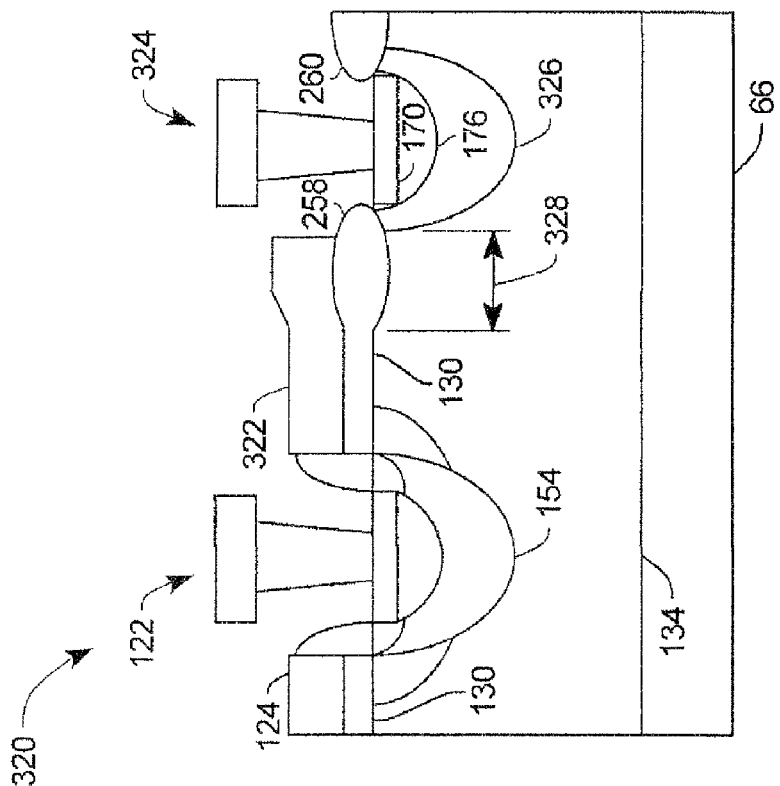
FIG. 14 is the P channel LDMOS device of FIG. 13 with a split gate oxide.

FIG. 14 is a split gate oxide P channel LDMOS device 330 which is the P channel LDMOS device 320 of FIG. 7 with the split gate oxide 182. Because of the split gate oxide 182 the field gap drift region 332 is longer than the field gap drift region 328 shown in FIG. 13 although the distance between the sources 132 and the drains 324 is the same for both devices.

Figure 16:
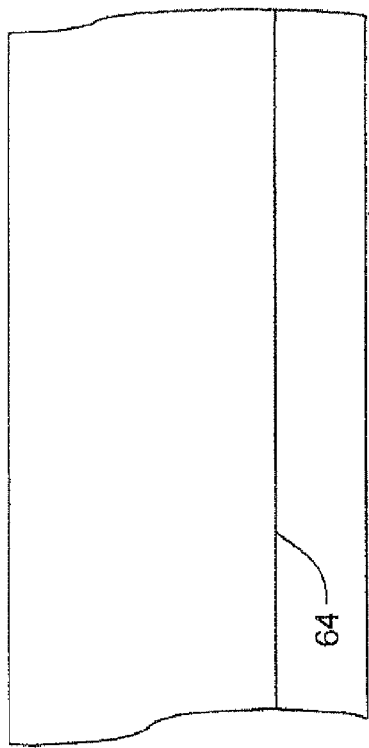
FIG. 16 is a diagrammatical view of a first step in creating the N channel LDMOS device of FIG. 2.
Figure 18:
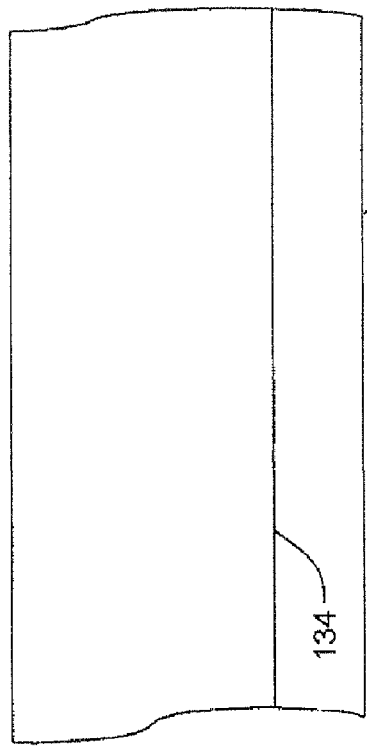
FIG. 18 is a diagrammatical view of a first step in creating the P channel LDMOS device of FIG. 4.
Figure 15:
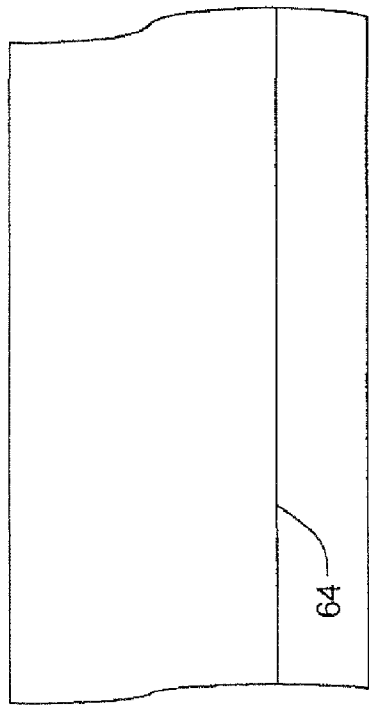
FIG. 15 is a diagrammatical view of a first step in creating the N channel LDMOS device of FIG. 1.
Figure 17:
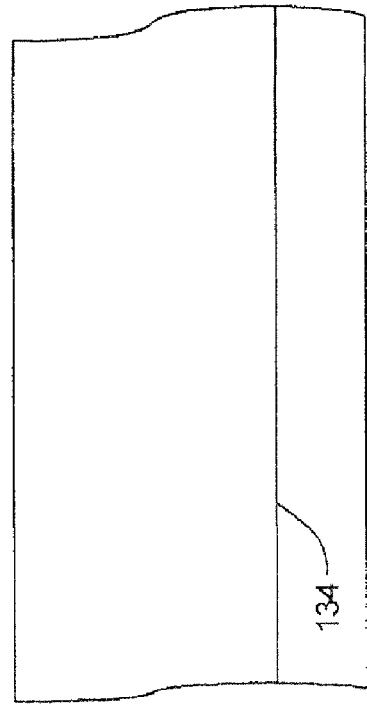
FIG. 17 is a diagrammatical view of a first step in creating the P channel LDMOS device of FIG. 3.
Figure 19:
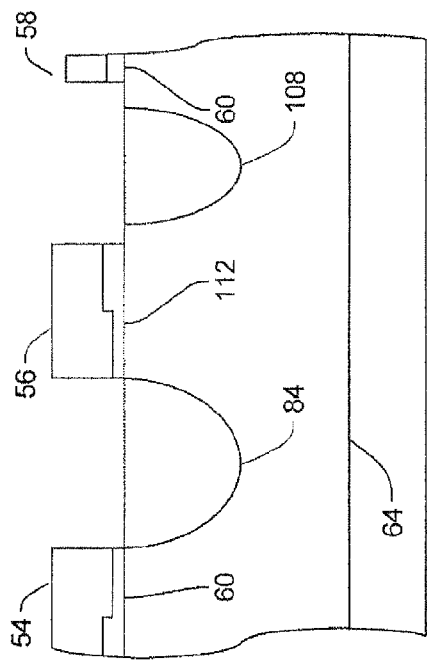
FIG. 19 is a diagrammatical view of a later step in creating the N channel LDMOS device of FIG. 1.
Figure 20:
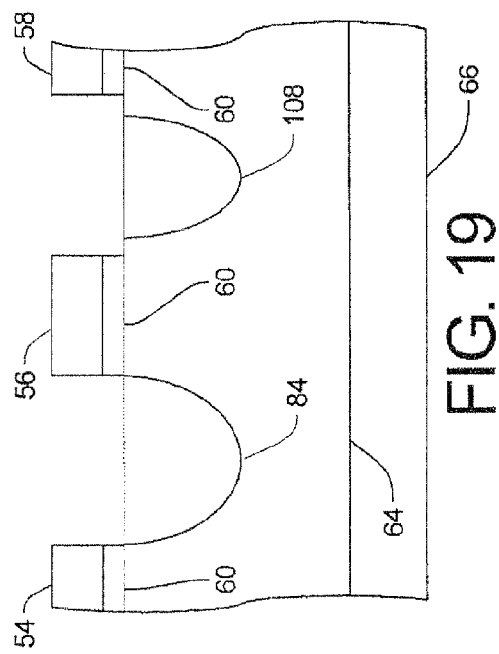
FIG. 20 is a diagrammatical view of a later step in creating the N channel LDMOS device of FIG. 2.
Figure 21:
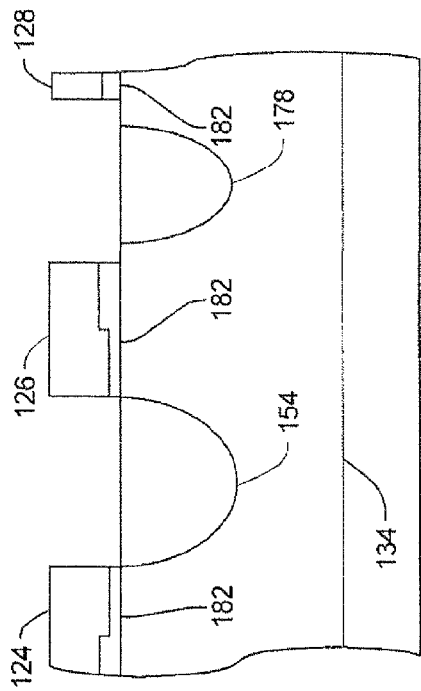
FIG. 21 is a diagrammatical view of a later step in creating the P channel LDMOS device of FIG. 3.
Figure 22:
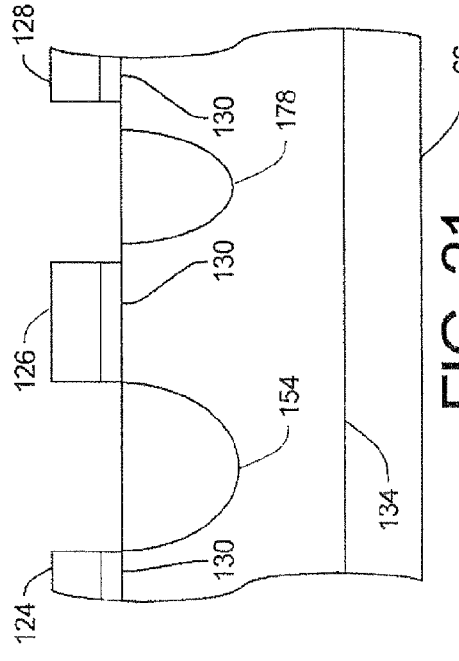
FIG. 22 is a diagrammatical view of a later step in creating the P channel LDMOS device of FIG. 4.

FIGS. 15, 16, 17, and 18 are diagrammatical views of a first step in creating the N channel LDMOS devices of FIGS. 1 and 2, and the P channel LDMOS devices of FIGS. 3 and 4, respectively, showing the HV NWELLs 64 in FIGS. 15, 16 and the HV PWELLs 134 in FIGS. 17, 18 which optionally are above another layer 66 which may be an N buried layer or an N isolation layer.

FIGS. 19, 20, 21, and 22 are diagrammatical views of a later step in creating the N channel LDMOS devices of FIGS. 1 and 2, and the P channel LDMOS devices of FIGS. 3 and 4, respectively, wherein the gates 54, 56, 58, 124 of FIGS. 1 and 2 and their respective gate oxides, and the gates 124, 126 and 128 of FIGS. 3 and 4 and their respective gate oxides are formed. After the gates are formed, the P wells 84 and N wells 108 of FIGS. 1 and 2 are formed, and the N wells 154 and P wells 178 of FIGS. 3 and 4 are formed. The P wells 84 and the N wells 154 are self aligned with the gates 54, 56 and 124, 126, respectively.

Figure 23:
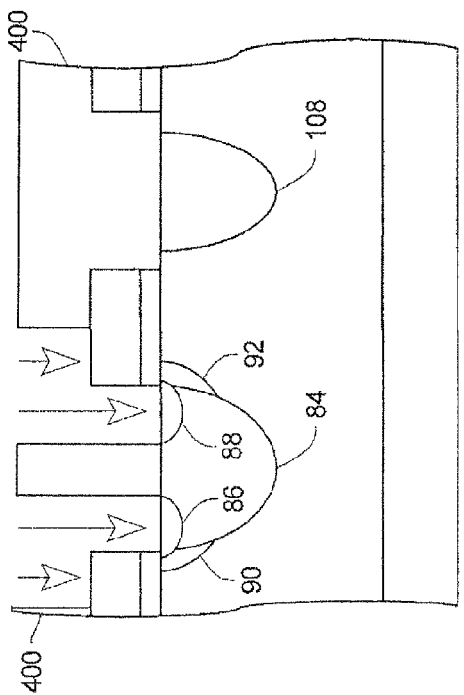
FIG. 23 is a diagrammatical view of a still later step in creating the N channel LDMOS device of FIG. 1.
Figure 24:
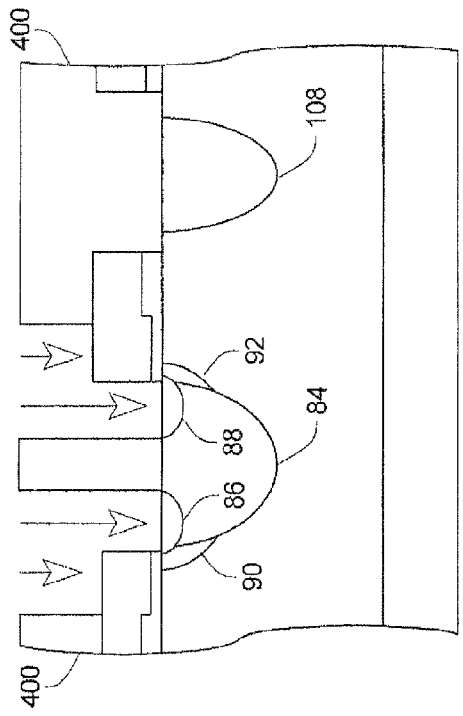
FIG. 24 is a diagrammatical view of a still later step in creating the N channel LDMOS device of FIG. 2.
Figure 25:
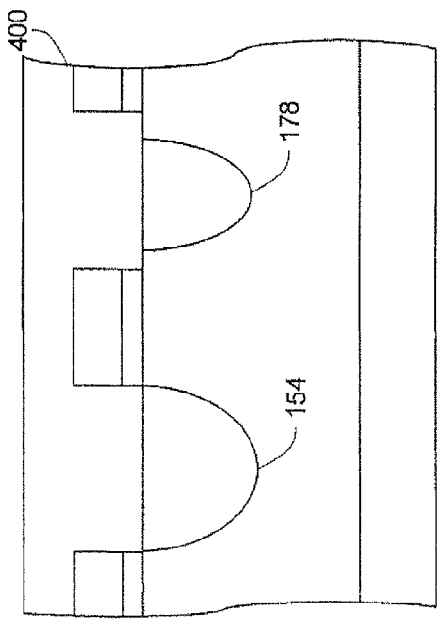
FIG. 25 is a diagrammatical view of a still later step in creating the P channel LDMOS device of FIG. 3.
Figure 26:
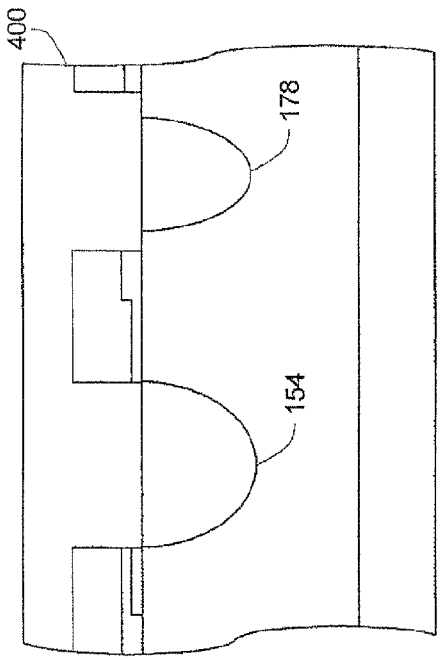
FIG. 26 is a diagrammatical view of a still later step in creating the P channel LDMOS device of FIG. 4.
Figure 27:
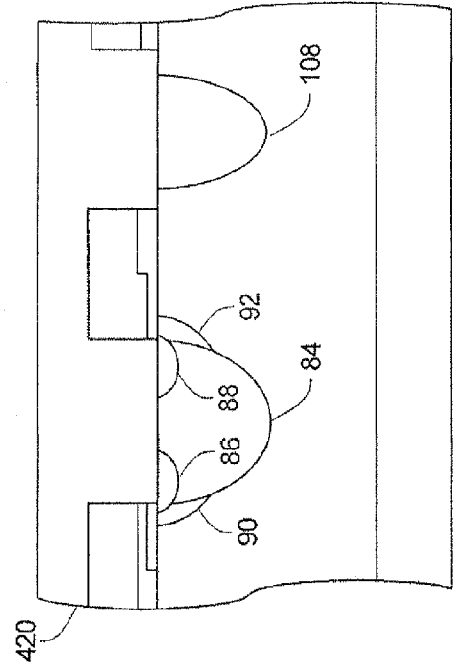
FIG. 27 is a diagrammatical view of a still later step in creating the N channel LDMOS device of FIG. 1.
Figure 29:
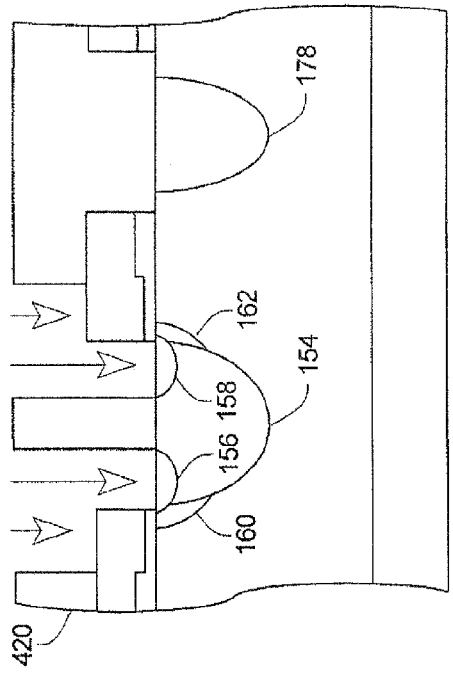
FIG. 29 is a diagrammatical view of a still later step in creating the P channel LDMOS device of FIG. 3.
Figure 28:
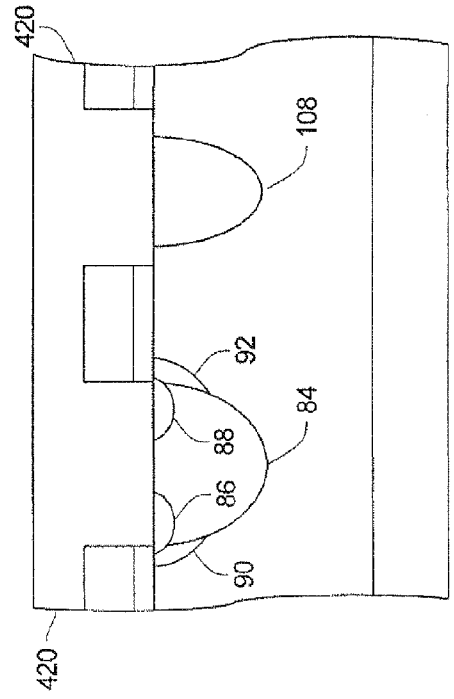
FIG. 28 is a diagrammatical view of a still later step in creating the N channel LDMOS device of FIG. 2.
Figure 30:
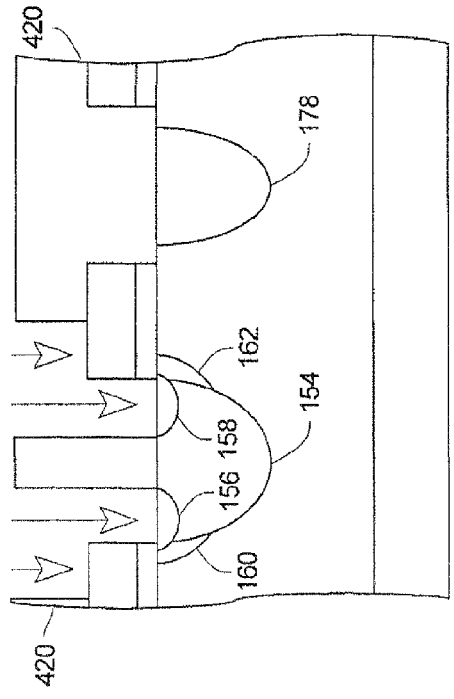
FIG. 30 is a diagrammatical view of a still later step in creating the P channel LDMOS device of FIG. 4.

FIGS. 23, 24, 25, and 26 are diagrammatical views of a still later step in creating the N channel LDMOS devices of FIGS. 1 and 2, and the P channel LDMOS devices of FIGS. 3 and 4, respectively, wherein photoresist 400 is applied to the wafer and patterned to form the regions shown in FIGS. 23-26. In FIGS. 23 and 24, the N channel devices are ion implanted after the photoresist 400 is in place, as indicated by the arrows, to form the P bodies 90 and 92 and the N+ source spacers 86 and 88. The gates 54 and 56 act as masks to align on edge of the P bodies 90 and 92, and the N+ source spacers 86 and 88. During this time the P channel devices shown in FIGS. 25 and 26 are completely covered with photoresist 400.

FIGS. 27, 28, 29, and 30 are diagrammatical views of a still later step in creating the N channel LDMOS devices of FIGS. 1 and 2, and the P channel LDMOS devices of FIGS. 3 and 4, respectively, wherein the layer of photoresist 400 has been removed and another layer 420 is applied and patterned in order to form the N bodies 160 and 162 and the P+ source spaces 156 and 158 in the same manner as the P bodies 90 and 92, and the N+ source spacers 86 and 88 were formed in FIGS. 23 and 24.

Figure 31:
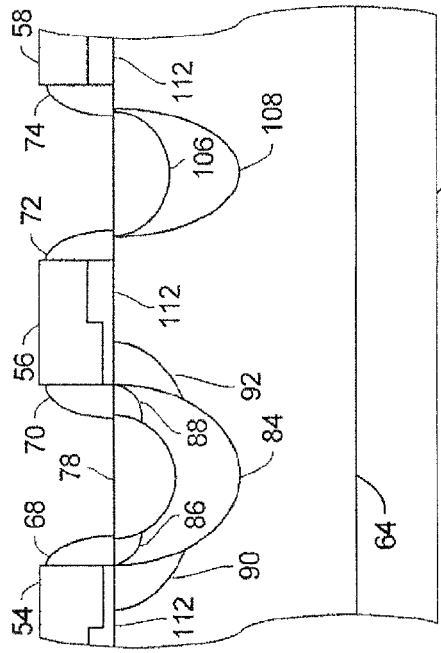
FIG. 31 is a diagrammatical view of a still later step in creating the N channel LDMOS device of FIG. 1.
Figure 32:
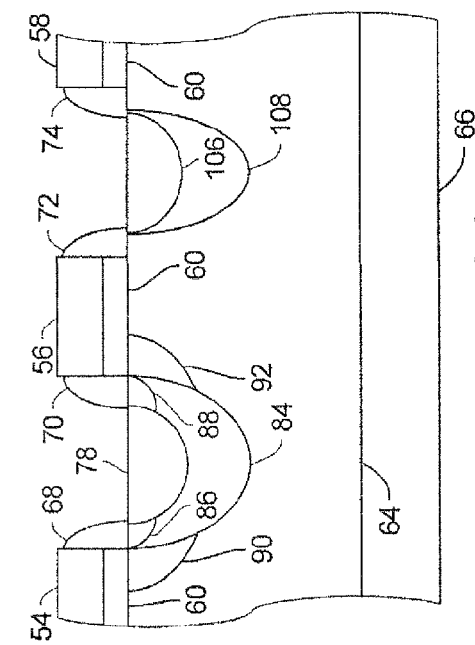
FIG. 32 is a diagrammatical view of a still later step in creating the N channel LDMOS device of FIG. 2.
Figure 33:
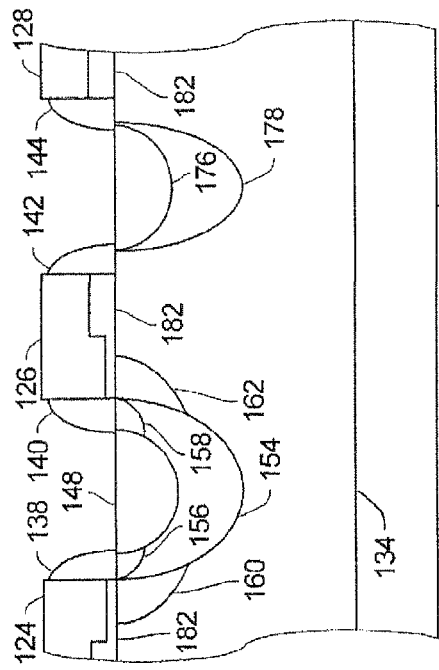
FIG. 33 is a diagrammatical view of a still later step in creating the P channel LDMOS device of FIG. 3.
Figure 34:
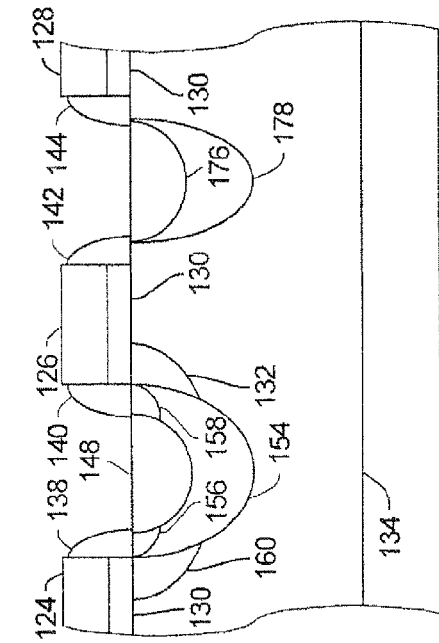
FIG. 34 is a diagrammatical view of a still later step in creating the P channel LDMOS device of FIG. 4.

FIGS. 31, 32, 33, and 34 are diagrammatical view of a still later step in creating the N channel LDMOS devices of FIGS. 1 and 2, and the P channel LDMOS devices of FIGS. 3 and 4, respectively, wherein an oxide layer has been placed on the wafer and then anisotropically etched to form the sidewall oxides 68, 70, 72 and 74 in FIGS. 31 and 32, and the sidewall oxides 138, 140, 142, and 144 in FIGS. 33 and 34. After the sidewall oxides are in place, they are used to self align the P+ source region 78 and the N+ drain region 106 in FIGS. 31 and 32, and to self align the N+ source region 148 and the P+ drain region 176 in FIGS. 31 and 32.

After the processing shown in FIGS. 31-34 are completed. The silicides for the sources and drains shown in FIGS. 1-4 are formed again using the sidewall oxides for alignment, and the contacts and metallization shown in FIGS. 1-4 are then formed.

The LDMOS devices of the embodiments described herein can be produced at a relatively low cost due to the relatively simple process.

Figure 36A:
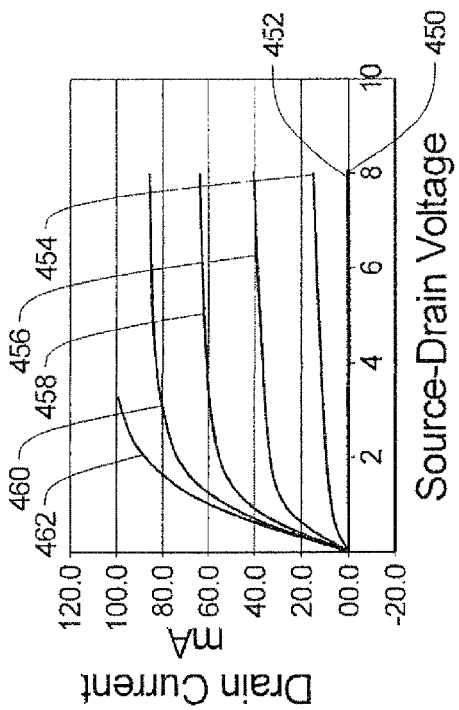
FIGS. 36A, 36B and 36C are measured data of a first fabricated N channel LDMOS device shown in FIG. 35.
Figure 35:
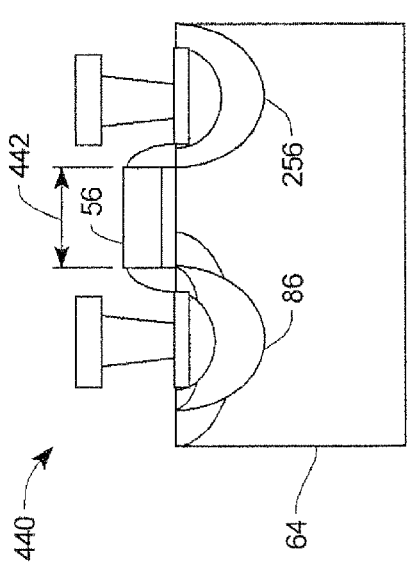
FIG. 35 is a diagrammatical view of a fabricated N channel LDMOS device according to an embodiment of the present invention.

FIG. 35 is a diagrammatical view of a fabricated N channel LDMOS device 440 according to an embodiment of the present invention which is the embodiment of FIG. 1 but with the N well 108 of FIG. 1 replaced with the N well 256 of FIGS. 7 and 8. The LDMOS device 440 has a zero length drift region since the drain side of the edge of the gate 56 aligns vertically with the gate side of the N well 256 at the top of the HV NWELL 64. The characteristics the LDMOS device 44 are shown in FIGS. 36A, B, and C and 37A, B, and C. The devices used to generate the characteristics shown in FIGS. 36A, B, and C have a gate length (indicated by dimension 442 in FIG. 35) of 0.35 μm, and the devices used to generate the characteristics shown in 37A, B, and C have a gate length of 0.40 μm.

Figure 36C:
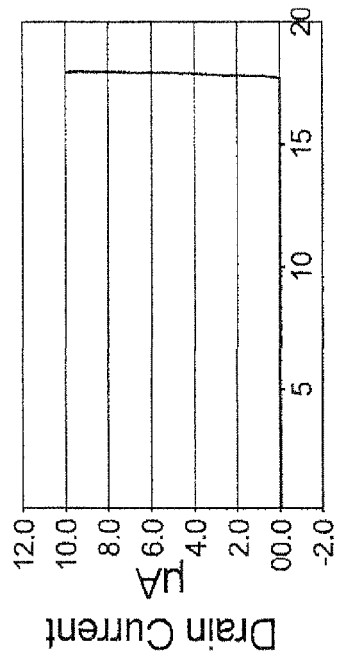
Figure 36B:
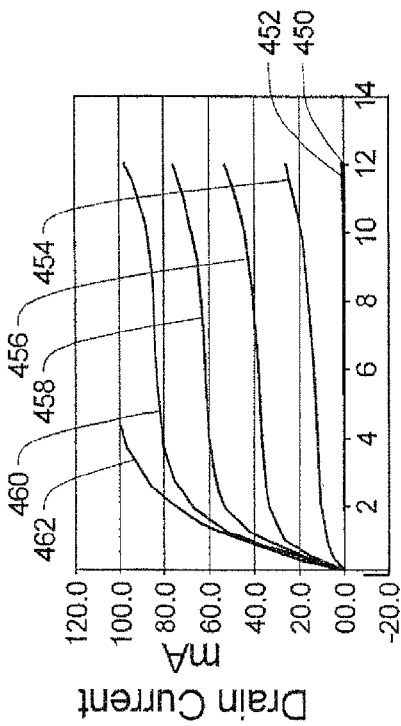

FIGS. 36A and 36B show the drain current versus the source to drain voltage for the LDMOS device 440 for varying levels of gate to source voltage. In both FIGS. 36A and 36B the drain current is limited to 100 ma, while in FIG. 36A the source to drain voltage is limited to 8 volts, and in FIG. 37B the gate to source voltage is limited to 12 volts. The gate to source voltages used to generate the curves in FIGS. 36A, 36B, 37A, and 37B are shown in the following table:

| Gate to Source Voltage | Reference Number |
|---|---|
| 0 volts | 450 |
| 2 volts | 452 |
| 4 volts | 454 |
| 6 volts | 456 |
| 8 volts | 458 |
| 10 volts | 460 |
| 12 volts | 462 |

FIG. 36C shows the drain current versus the reverse drain to source voltage, indicating a breakdown voltage of about 18 volts.

Figure 37A:
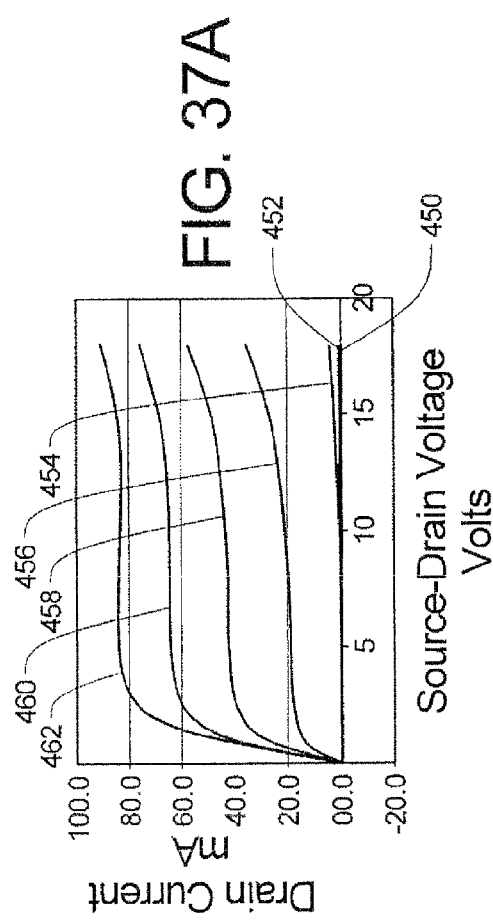
FIGS. 37A, 37B and 37C are measured data of a second fabricated N channel LDMOS device shown in FIG. 35.
Figure 37C:
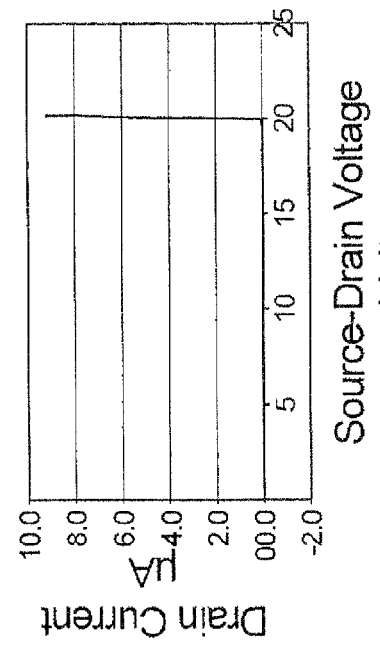
Figure 37B:
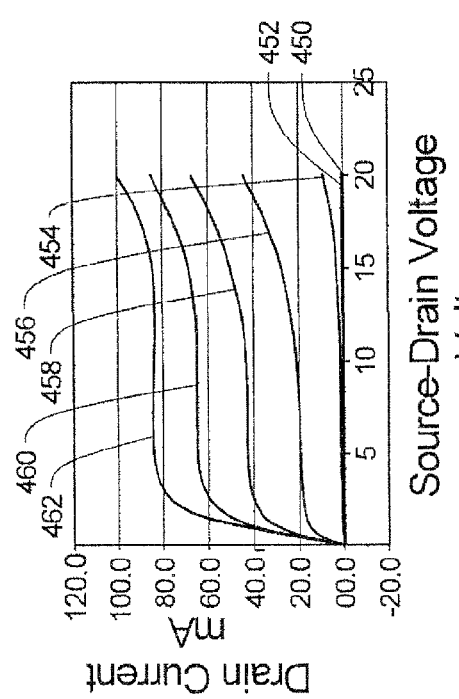

FIGS. 37A, 37B, and 37C are the comparable characteristics shown in FIGS. 36A, 36B and 36C, but are from the LDMOS device 440 with a gate length of 0.40 μm. As a result, the gains shown in FIGS. 37A and 37B are less than those shown in FIGS. 36A and 36B, respectively, but the breakdown voltage increases to about 20 volts in FIG. 37C. The LDMOS device of FIG. 35 with a gate length of 0.40 μm has a pitch of about 1.6 μm.

The following is a table of the best data silicon taken on one or more embodiments of the present invention for devices with a gate oxide thickness of 400 Å:

| Characteristic | 8 V DMOS | 12 V DMOS | 16 V DMOS | 20 V DMOS |
|---|---|---|---|---|
| Vt (volts) | 2.99 | 3.03 | 3.15 | 3.16 |
| On-State BV (volts) (at 12 V $V_{gs}$) | 8 | 12 | 16 | 20 |
| $BV_{dss}$ (volts) | 17.8 | 18.7 | 20.2 | 20.7 |
| R(sp, on) (mΩ · mm$^2$) | 4.87 | 5.74 | 6.00 | 6.49 |

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

The invention claimed is:

1. A self-aligned LDMOS device, comprising:
a gate having a gate electrode and a gate oxide, and an oxide spacer on a source side of the gate;
a source having a tap and a source spacer embedded in a source well, wherein the tap and the source well are of a first conductivity type and the source spacer is of a second conductivity type opposite to the first conductivity type, the tap being self-aligned with an edge of the oxide spacer and the source spacer being self-aligned with the edge of the gate electrode such that the source spacer is substantially under the oxide spacer; and
a drain situated opposite to the source side of the gate, the drain having a drain region embedded in a drain well.

2. The self-aligned LDMOS device of claim 1, the tap and the source well comprising an N type dopant and the source spacer, the drain, and the drain well comprising a P type dopant.

3. The self-aligned LDMOS device of claim 2, further comprising a complementary transistor having a complementary gate, a complementary source, and a complementary drain.

4. The self-aligned LDMOS device of claim 3, the complementary source region comprising a P type tap and a P type source well; and the drain region comprising an N type source spacer, an N type drain, and an N type drain well.

5. The self-aligned LDMOS device of claim 1, the gate oxide being thick along substantially the entire cross-section of said gate.

6. The self-aligned LDMOS device of claim 1, the gate oxide being thin proximate to the source and thick proximate to the drain.

7. The self-aligned LDMOS device of claim 6, further comprising a second transistor gate with a second transistor gate oxide that is thick along substantially the entire cross-section of said second transistor gate.

8. The self-aligned LDMOS device of claim 6, further comprising an isolation ring surrounding the gate, source, and drain.

9. The self-aligned LDMOS device of claim 8, further comprising a field oxide extending from the isolation region to the source on the source side of the gate.

10. The self-aligned LDMOS device of claim 9, further comprising a high voltage N well extending laterally from the isolation ring to the source well on the source side of the gate.

11. The self-aligned LDMOS device of claim 6, further comprising a field oxide extending from the gate oxide to the drain, and the gate having a polysilicon layer above the field oxide which extends laterally toward the drain to a location on the field oxide.

12. The self-aligned LDMOS device of claim 11, wherein the drain well extends laterally under the field oxide.

13. The self-aligned LDMOS device of claim 1, further comprising an isolation ring surrounding the gate, source, and drain.

14. The self-aligned LDMOS device of claim 13, further comprising a field oxide extending from the isolation region to the source side of the gate.

15. The self-aligned LDMOS device of claim 13, further comprising a high voltage N well extending laterally from the isolation ring to the source well on the source side of the gate.

16. The self-aligned LDMOS device of claim 1, further comprising a field oxide extending from the gate oxide to the drain, and the gate having a polysilicon layer above the field oxide which extends laterally toward the drain to a location on the field oxide.

17. The self-aligned LDMOS device of claim 16, wherein the drain well extends laterally under the field oxide.

18. The self-aligned LDMOS device of claim 1 further comprising a silicide layer in contact with the tap and the source spacer, but only in contact with a side of the source spacer.

19. The self-aligned LDMOS device of claim 1 wherein the source spacer is highly doped.

20. The self-aligned LDMOS device of claim 1 wherein the source region further includes a body of the first conductivity type that extends under the gate electrode.

21. A self-aligned LDMOS device, comprising:
a gate having a gate electrode and a gate oxide and an oxide spacer on a source side of the gate;
a source region having a tap and a highly doped source spacer embedded in a source well, the tap being self-aligned with an edge of the oxide spacer and the source spacer being self-aligned with the edge of the gate electrode such that the source spacer is substantially under the oxide spacer; and
a drain region on a drain side of the gate.

22. The self-aligned LDMOS device of claim 21, the gate oxide having a thickness selected from the group consisting of about 400 Å and 600 Å.

23. The self-aligned LDMOS device of claim 22, the gate oxide being thick on the source side of said gate.

24. The self-aligned LDMOS device of claim 22, the gate comprising an oxide spacer on the source side and the source region comprising a source that is fully under the oxide spacer.

25. The self-aligned LDMOS device of claim 21, the gate being a split gate with a thin gate oxide on the source side.

26. The self-aligned LDMOS device of claim 25, the thin gate oxide having a thickness selected from the group consisting of about 45 Å, about 60 Å, and about 115 Å.

27. The self-aligned LDMOS device of claim 21 further comprising a silicide layer in contact with the tap and the source spacer, but only in contact with a side of the source spacer.

28. The self-aligned LDMOS device of claim 21, wherein the tap and the source well are of a first conductivity type and the source spacer is of a second conductivity type opposite to the first conductivity type.

29. The self-aligned LDMOS device of claim 21 wherein the source region further includes a body of the first conductivity type that extends under the gate electrode.

* * * * *